United States Patent
Harris et al.

(10) Patent No.: US 10,211,127 B1
(45) Date of Patent: Feb. 19, 2019

(54) INTEGRATION OF CHIP LEVEL MICRO-FLUIDIC COOLING IN CHIP PACKAGES FOR HEAT FLUX REMOVAL

(71) Applicant: Lockheed Martin Corporation, Bethesda, MD (US)

(72) Inventors: Daniel W. Harris, Mercerville, NJ (US); John Ditri, Huntingdon Valley, PA (US); Joseph W. Hahn, Erial, NJ (US); Michael K. McNulty, Cherry Hill, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/599,781

(22) Filed: May 19, 2017

Related U.S. Application Data

(62) Division of application No. 15/082,576, filed on Mar. 28, 2016, now Pat. No. 9,659,838.

(51) Int. Cl.
*F28D 15/00* (2006.01)
*H01L 23/46* (2006.01)

(52) U.S. Cl.
CPC .............. *H01L 23/46* (2013.01); *F28D 15/00* (2013.01)

(58) Field of Classification Search
CPC ........... H05K 7/20; H01L 21/00; H01L 21/02; H01L 23/34; H01L 23/44; H01L 23/46; H01L 23/433; H01L 23/473; F28D 15/00; F28D 15/02; F28D 15/06; F28F 7/00
USPC ....... 174/252, 15.1; 361/689, 697, 699–703; 165/80.3, 80.4, 96, 104.11, 104, 21, 165/104.33, 168, 170, 185; 206/438
See application file for complete search history.

(56) References Cited

U.S. PATENT DOCUMENTS

| | | | | |
|---|---|---|---|---|
| 4,381,032 A | * | 4/1983 | Cutchaw | H01L 23/4338 165/185 |
| 4,531,146 A | * | 7/1985 | Cutchaw | H01L 23/433 257/697 |
| 4,612,978 A | * | 9/1986 | Cutchaw | H01L 23/433 165/104.33 |
| 4,730,665 A | * | 3/1988 | Cutchaw | H01L 23/433 165/185 |
| 4,884,169 A | * | 11/1989 | Cutchaw | H01L 23/427 165/104.33 |
| 5,097,385 A | * | 3/1992 | Chao-Fan Chu ... | H01L 23/4336 165/104.33 |
| 5,161,089 A | * | 11/1992 | Chu | H01L 23/4338 165/185 |
| 5,170,319 A | * | 12/1992 | Chao-Fan Chu ... | H01L 23/4338 165/170 |

(Continued)

*Primary Examiner* — Xiaoliang Chen
(74) *Attorney, Agent, or Firm* — Howard IP Law Group

(57) ABSTRACT

An electronic chip package includes a base defining a fluid inlet opening for receiving pressurized fluid from a fluid source and a fluid outlet opening. A dielectric body is arranged on the base and configured to support an electronic device. The dielectric body comprises a coolant flow chamber formed in a first surface thereof, and a plurality of impingement openings formed within the coolant flow chamber. The plurality of impingement openings are in communication with the fluid inlet opening of the base for generating a plurality of fluid streams to be expelled into the coolant flow chamber. The body further comprises a coolant return port formed within the coolant flow chamber and in communication with the fluid outlet opening of the base.

13 Claims, 5 Drawing Sheets

(56) References Cited

U.S. PATENT DOCUMENTS

| | | | | |
|---|---|---|---|---|
| 5,587,880 A * | 12/1996 | Phillips | ............... | F28D 15/0266 165/104.29 |
| 5,798,469 A * | 8/1998 | Nufer | ............... | B22F 5/007 156/89.11 |
| 5,835,345 A * | 11/1998 | Staskus | ............... | H01S 5/02423 165/80.4 |
| 5,856,174 A * | 1/1999 | Lipshutz | ............... | B01F 11/0071 422/68.1 |
| 5,945,334 A * | 8/1999 | Besemer | ............... | B01J 19/0046 422/552 |
| 6,109,222 A * | 8/2000 | Glezer | ............... | F02B 71/04 123/46 E |
| 6,146,462 A * | 11/2000 | Yializis | ............... | B05D 3/144 118/718 |
| 6,168,948 B1 * | 1/2001 | Anderson | ............... | B01F 11/0266 366/DIG. 3 |
| 6,287,850 B1 * | 9/2001 | Besemer | ............... | B01F 13/0054 435/283.1 |
| 6,505,811 B1 * | 1/2003 | Barron | ............... | B60T 8/363 251/129.01 |
| 6,796,370 B1 * | 9/2004 | Doll | ............... | F28F 3/048 165/168 |
| 6,919,231 B1 * | 7/2005 | Ramanathan | ............... | H01L 23/473 257/714 |
| 6,986,382 B2 * | 1/2006 | Upadhya | ............... | F04B 19/006 165/104.21 |
| 6,988,534 B2 * | 1/2006 | Kenny | ............... | F04B 17/00 165/104.21 |
| 7,000,684 B2 * | 2/2006 | Kenny | ............... | F04B 17/00 165/104.21 |
| 7,017,654 B2 * | 3/2006 | Kenny | ............... | F28F 3/086 165/104.33 |
| 7,104,312 B2 * | 9/2006 | Goodson | ............... | F04B 19/006 165/104.33 |
| 7,836,597 B2 * | 11/2010 | Datta | ............... | F04B 17/00 165/104.33 |
| 2003/0013317 A1 * | 1/2003 | Martin | ............... | H01L 21/30604 438/745 |
| 2003/0085024 A1 * | 5/2003 | Santiago | ............... | B01D 19/0031 165/104.11 |
| 2005/0100946 A1 * | 5/2005 | Lipshutz | ............... | B01L 3/502715 435/6.12 |
| 2005/0168949 A1 * | 8/2005 | Tilton | ............... | H01L 23/4735 361/699 |
| 2006/0002087 A1 * | 1/2006 | Bezama | ............... | F28F 3/12 361/699 |
| 2007/0023719 A1 * | 2/2007 | Shannon | ............... | F16K 31/025 251/129.01 |
| 2007/0132470 A1 * | 6/2007 | Kamakura | ............... | H01S 5/0014 324/750.08 |
| 2007/0163749 A1 * | 7/2007 | Miyahara | ............... | H01L 23/473 165/80.3 |
| 2007/0246192 A1 * | 10/2007 | Cunningham | .... | H01L 21/67109 165/96 |
| 2008/0047622 A1 * | 2/2008 | Fuller | ............... | F16K 99/0001 137/625.18 |
| 2008/0050830 A1 * | 2/2008 | Floriano | ............... | G01N 33/5094 436/63 |
| 2008/0149869 A1 * | 6/2008 | Shannon | ............... | F16K 31/02 251/129.01 |
| 2008/0151501 A1 * | 6/2008 | Takasou | ............... | H05K 7/20154 361/697 |
| 2008/0176253 A1 * | 7/2008 | Christodoulides | ... | G01N 33/543 435/7.21 |
| 2008/0210405 A1 * | 9/2008 | Datta | ............... | F04B 17/00 165/102 |
| 2008/0213638 A1 * | 9/2008 | Brantley | ............... | C01B 3/0005 429/413 |
| 2009/0036668 A1 * | 2/2009 | Elizarov | ............... | B01J 19/0093 536/122 |
| 2010/0291588 A1 * | 11/2010 | McDevitt | ............... | B01L 3/502715 435/7.2 |
| 2011/0002102 A1 * | 1/2011 | Brok | ............... | H01L 23/467 361/701 |
| 2011/0014606 A1 * | 1/2011 | Steinmetzer | ............... | B01J 19/0046 435/6.11 |
| 2012/0186338 A1 * | 7/2012 | Bonnat | ............... | G01P 5/04 73/272 R |
| 2012/0212907 A1 * | 8/2012 | Dede | ............... | H01L 23/4735 361/702 |
| 2012/0257354 A1 * | 10/2012 | Dede | ............... | H01L 23/473 361/703 |
| 2013/0008263 A1 * | 1/2013 | Kabasawa | ............... | G01F 1/383 73/861.42 |
| 2014/0027431 A1 * | 1/2014 | Cheng | ............... | H01L 24/75 219/162 |
| 2014/0346071 A1 * | 11/2014 | Genosar | ............... | A61J 1/067 206/438 |

\* cited by examiner

INTEGRATION OF CHIP LEVEL MICRO-FLUIDIC COOLING IN CHIP PACKAGES FOR HEAT FLUX REMOVAL

CROSS-REFERENCE TO RELATED APPLICATIONS

This application is a divisional application of U.S. patent application Ser. No. 15/082,576, now issued U.S. Pat. No. 9,659,838, entitled INTEGRATION OF CHIP LEVEL MICRO-FLUIDIC COOLING IN CHIP PACKAGES FOR HEAT FLUX REMOVAL, filed Mar. 28, 2016, the entire contents of which is herein incorporated by reference for all purposes.

FIELD OF THE INVENTION

The present disclosure relates to cooling systems and methods for use with electronic circuits, and more particularly, to integrated circuit packages featuring embedded cooling provisions.

BACKGROUND

The performance of many commercial and military electronic systems, including digital, power and microwave systems, is constrained by the cooling capabilities of conventional thermal management systems and methods. Heat flux within devices continues to increase as new technologies are developed. For example, enhanced performance capabilities of digital processors and associated memory devices are accompanied by increased heat generation. Likewise, power devices such as amplifiers, regulators and power converters continue to provide increased capability despite smaller packaging, resulting in higher dissipated power densities.

In the microwave field, the introduction of Gallium Nitride (GaN) transistors in place of traditional gallium arsenide (GaAs) devices has resulted in heat flux increases of at least one order of magnitude. For example, field effect transistors (FETs) produced in GaN can dissipate about 10 watts per millimeter (W/mm) of gate width compared to 1 W/mm in GaAs FETs. Microwave amplifiers, often embodied as monolithic microwave integrated circuits (MMICs), are built by grouping these FETs side by side and in multiple stages to realize a desired or target gain and RF power of a given device. The resulting power density in these MMIC amplifiers has increased from approximately 100 watts per square centimeter ($W/cm^2$) in GaAs applications, to approximately 30K $W/cm^2$ in GaN configurations. In addition, GaN devices can withstand higher temperatures compared to GaAs devices, and thus are operated at higher drive levels which leads to even higher power densities. These high power GaN microwave amplifiers are used in applications ranging from cellular systems (e.g. cellular phones) to radars, target illuminators, communication devices and electronic warfare equipment for the defense industry. The performance of these devices has become limited by the abilities of conventional cooling techniques to efficiently remove the increased heat generated by these systems.

Referring generally to FIG. 1, there is shown a typical "remote cooling" thermal management system 10 for use with small-scale electronics, including integrated circuit packages. Heat generated by a source, embodied herein as a circuit die 12, is transferred through multiple intermediate material layers arranged between die 12 and a heat sink, such as a liquid-cooled cold plate 19. These layers may include, for example, a solder layer 13, a heat sink or heat spreading layer 14, a first epoxy layer 15, a module package including ceramic layer 16 (e.g. a transmitter/receiver module package), and a second epoxy layer 17 for attaching the module package to cold plate 19. As illustrated, each material presents a thermal resistance (Rth) to heat flow and adds to the overall thermal rise from the coolant to the device junction. While such assemblies provide some level of effectiveness, increases in device power and density resulting from packaging multiple devices together, have created systems with even greater cooling requirements. These systems, in many cases, exceed the capability of the present remote cooling approaches to maintain acceptable junction temperatures.

Alternate thermal management systems and techniques are needed.

SUMMARY

In one embodiment of the present disclosure, a substrate body for supporting an electronic device is provided. The body includes at least one electrical circuit formed thereon configured to be connected to the electronic device. A plurality of impingement openings are formed through the body, with each impingement opening configured to be responsive to a source of pressurized fluid for generating a fluid stream to be expelled in a direction of the electronic device.

In another embodiment, an electronic chip package is provided. The package includes a base defining a fluid inlet opening for receiving pressurized fluid from a fluid source and a fluid outlet opening. A dielectric body is arranged on the base and configured to support an electronic device. The dielectric body comprises a coolant flow chamber formed in a first surface thereof, and a plurality of impingement openings formed through the body within the coolant flow chamber. The plurality of impingement openings are in communication with the fluid inlet opening of the base for generating a plurality of fluid streams to be expelled into the coolant flow chamber. The body further comprises a coolant return port formed within the coolant flow chamber and in communication with the fluid outlet opening of the base.

DETAILED DESCRIPTION

Figure 1:
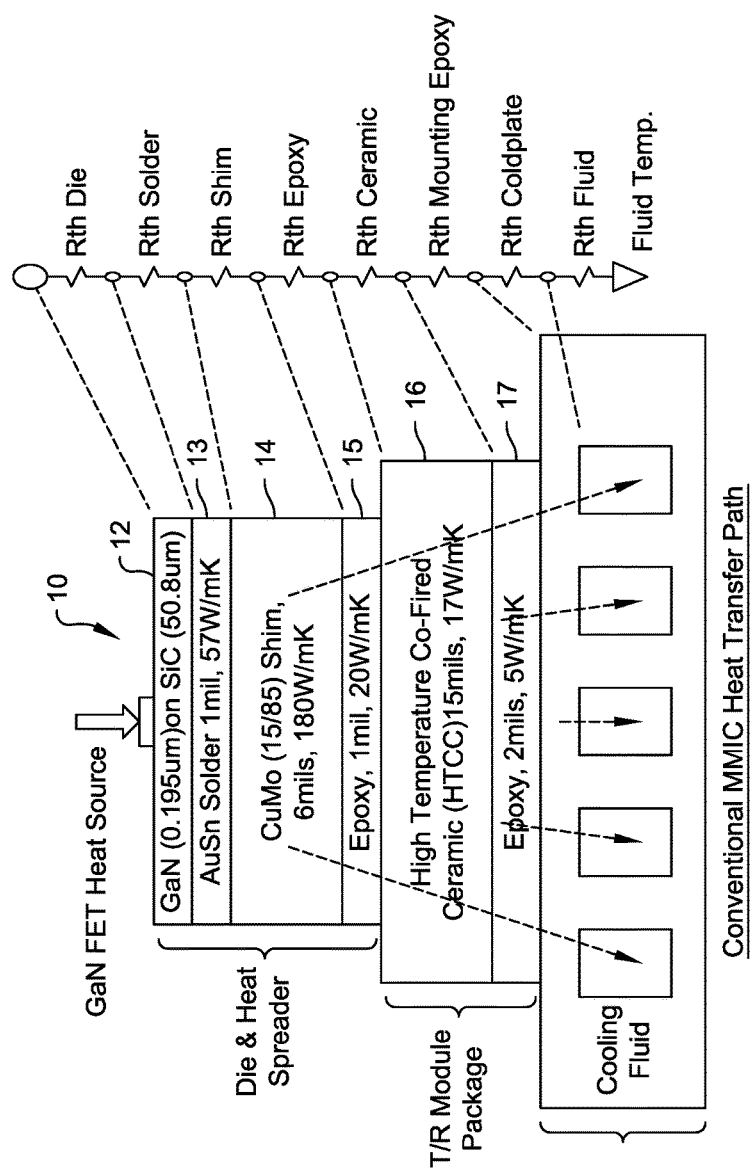
FIG. 1 is a simplified cross section view of a conventional remote cooling system.

It is to be understood that the figures and descriptions of the present invention have been simplified to illustrate elements that are relevant for a clear understanding of the present invention, while eliminating, for purposes of clarity, many other elements found in electronic circuits and associated cooling systems, including embedded cooling systems configured for cooling integrated circuits. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include the integration of micro-fluidic jet impingement cooling into an electronics package (e.g. a dielectric substrate of an MMIC device) for directly cooling targeted electronic devices or other heat-generating active components housed on or within the package. In one embodiment, a package substrate or body formed of a dielectric material (e.g. ceramic) includes a plurality of impingement jets or openings defining outlet nozzles formed therein. The impingement openings are configured (e.g. sized and located) for communication with a source of pressurized fluid or coolant. One or more coolant flow chambers and one or more coolant return channels may also be formed through all or a portion of the package body. The package body is configured to support one or more electronic devices or chips which may be hermetically attached to a surface thereof, and positioned over the plurality of impingement openings such that fluid expelled therefrom contacts a surface of the one or more devices for providing a direct cooling function.

Embodiments set forth herein may be implemented in a co-fired ceramic substrate, for example, a low temperature co-fired ceramic (LTCC) and/or a high temperature co-fired ceramic (HTCC) brazed to a metal base plate. Ceramic is particularly well-suited for direct attachment of the electronic device or chip due to its coefficient of thermal expansion which closely matches typical chip materials. Wire or ribbon bonds may be used to electrically interconnect the chip to portions of the package.

Embodiments of the present disclosure further include methods of manufacturing chip packages according to the above-described embodiments. An exemplary chip package may be manufactured by mechanically forming (e.g. punching) or laser drilling holes and/or cavities in individual layers of a dielectric substrate material (e.g. ceramic) while in their "green" or pre-fired state. In one embodiment, inlet and/or outlet coolant channels may be formed in one or more first or lower substrate layers. A plurality of impingement openings may be formed in one or more second or intermediate substrate layers. An opening defining a coolant flow chamber may be formed in one or more third or upper substrate layers. The inlet and outlet coolant channels, the plurality of impingement openings, and the opening defining the coolant flow chamber are positioned such that when the first, second and third substrate layers are aligned (e.g. stacked) on top of one another and laminated to form a completed package, pressurized fluid may be communicated to the plurality of impingement openings via the inlet coolant channel for generating a plurality of fluid streams expelled into the coolant flow chamber. In a particularly advantageous embodiment, the impingement openings may be positioned directly below an electronic device (and more particularly, a heat-generating source thereof) configured to be mounted to an upper surface of the third substrate layer(s). In this way, fluid expelled from the plurality of impingement openings directly contacts an underside of the electronic device, maximizing heat transfer therefrom.

Figure 2:
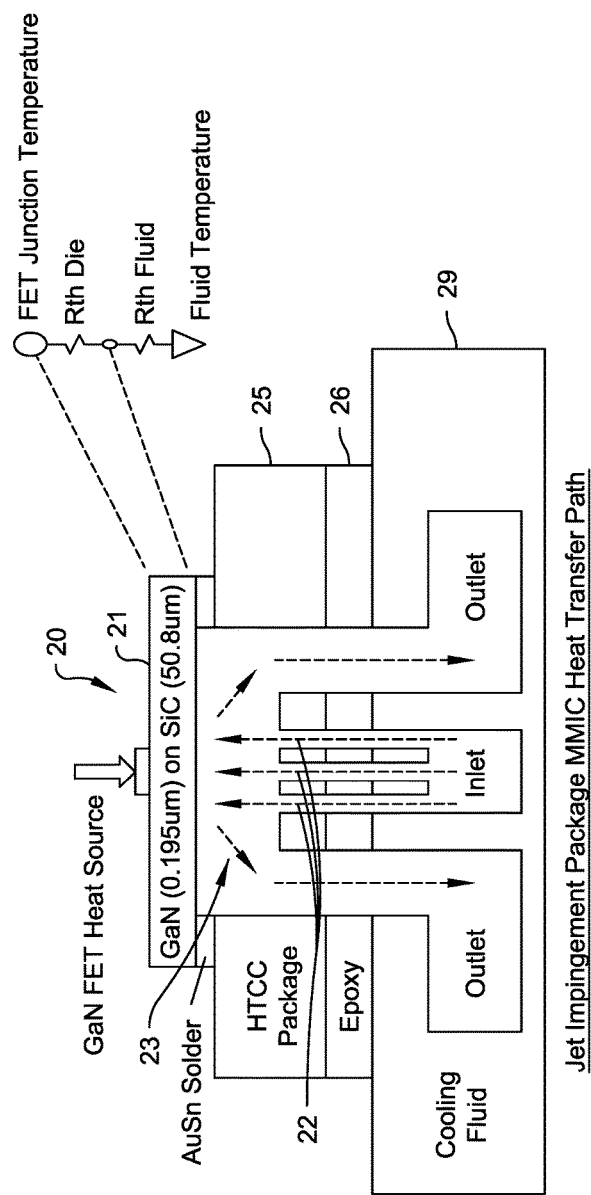
FIG. 2 is a simplified cross section view of an embedded cooling system utilizing jet impingement cooling according to an embodiment of the present disclosure.

Referring generally to FIG. 2, a simplified exemplary embedded cooling system 20 according to an embodiment of the present disclosure is shown. As illustrated, in contrast to the conventional remote cooling system 10 illustrated in FIG. 1, an embedded cooling arrangement delivers pressurized coolant 23 into close proximity with a circuit die 21 via fluid passages 22 formed through a package body on which circuit die 21 is supported. More specifically, coolant 23 from the "system level" heat sink or cold plate 29, is brought (e.g. pumped) through an intermediate fluid routing means embodied as a multi-layer ceramic package 25. Ceramic package 25 is configured to receive pressurized fluid and generate a plurality of fluid streams for contacting with a base or bottom side of circuit die 21 supported thereon. An epoxy layer 26 may be provided for attaching ceramic package 25 to cold plate 29.

In the illustrated embodiment, coolant 23 is conveyed via centrally located internal passages 22 formed through ceramic package 25, and directly contacts an underside of circuit die 21. In other embodiments, coolant 23 may not directly contact circuit die 21, but rather, may be contained in a self-sealed chamber defined in ceramic package 25 to which circuit die 21 is mounted. In this embodiment, a thin layer of material, such as solder or epoxy, may be used to join circuit die 21 to ceramic package 25. In these embodiments, however, the presence of the intermediate joining material may degrade performance to some degree, depending upon the thickness and thermal conductivity of the joining material used.

An advantage of embedded cooling systems according to embodiments of the present disclosure, such as those set forth above with respect to FIG. 2, is the elimination of a number of thermal interfaces between a cooling fluid or coolant and a heat source. In practice, such elimination can translate into a reduction in the overall thermal resistance from junction to coolant. The reduced thermal resistance, in turn, results in lower operating temperatures for a given circuit die dissipation, or conversely, allows a larger heat dissipation for a given temperature rise.

Figure 3A:
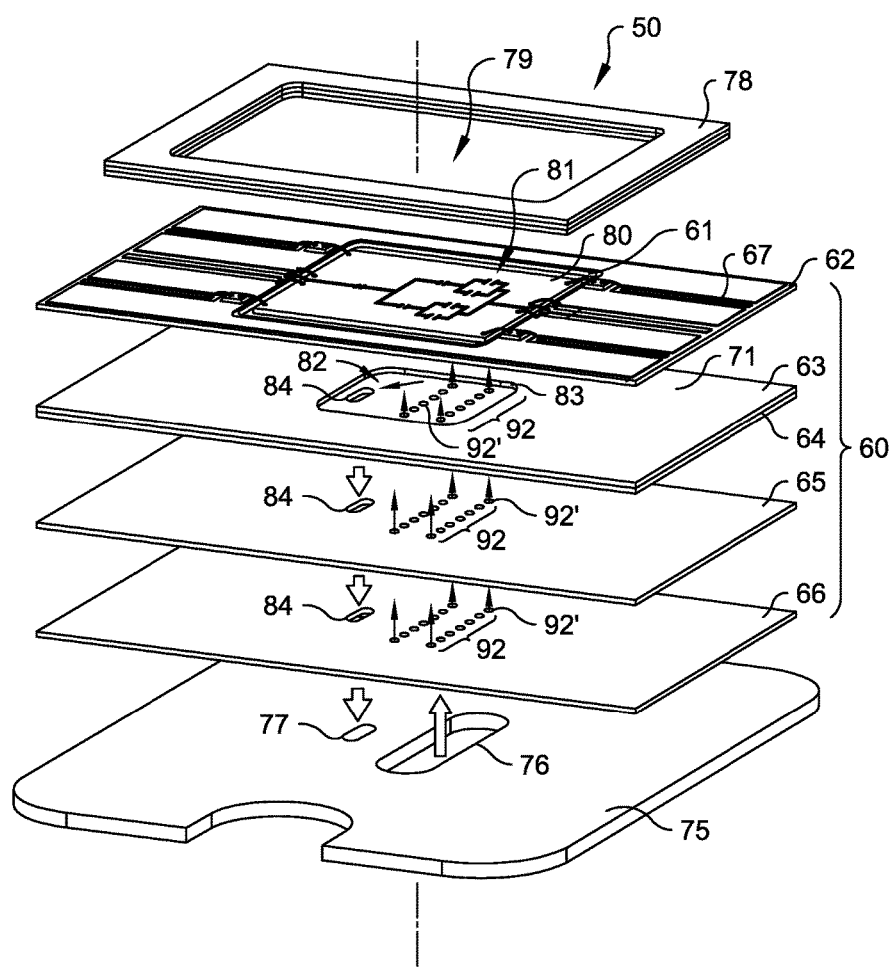
FIG. 3A is a simplified exploded perspective view of a jet impingement cooled chip package according to an embodiment of the present disclosure.
Figure 3B:
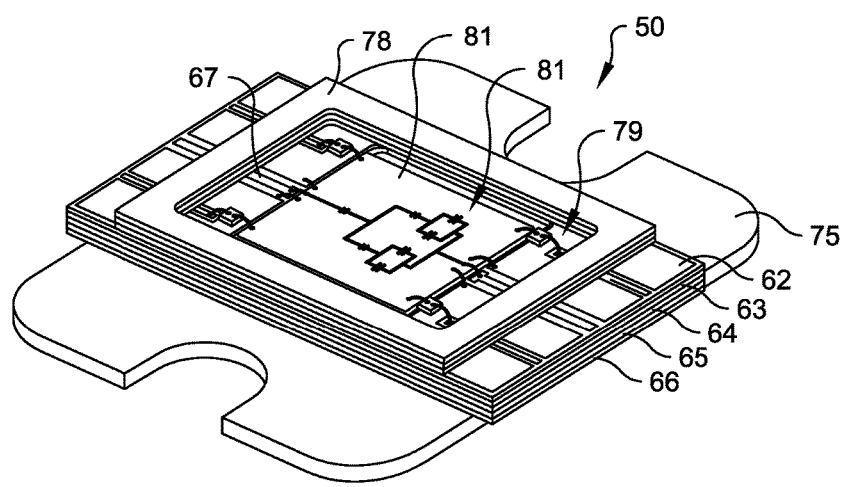
FIG. 3B is an assembled perspective view of the jet impingement cooled chip package according to the embodiment of FIG. 3A.

Referring generally to FIGS. 3A and 3B, simplified exploded (FIG. 3A) and assembled (FIG. 3B) illustrations of a micro jet impingement cooled package 50 according to an embodiment of the present disclosure are shown. Package 50 includes a circuit element or die 80 (e.g. a GaN/SiC integrated circuit such as one or more amplifiers). Circuit die 80 includes heat generating elements, such as FETs 81. Circuit die 80 is configured to be mounted to and supported by a substrate body 60 formed from a plurality of substrate layers 62,63,64,65,66. Each substrate layer 62,63,64,65,66 may comprise a dielectric material, for example, a section of ceramic tape having a thickness of approximately 2 mils.

In an assembled state, circuit die 80 may be arranged within an aperture 61 formed (e.g. mechanically punched or machined) in first substrate layer 62. First substrate layer 62 includes electrical circuits and/or pathways 67 formed thereon (e.g. printed thereon in the pre-fired state of the substrate layer) for generating required electrical connections to circuit die 80. Circuit die 80 may be connected to these features via conventional wire and/or ribbon bonding processes as illustrated.

Second substrate layer 63 is arranged vertically below or beneath first substrate layer 62 and defines a hermetic circuit die mounting surface 71 on a first or top surface thereof. Circuit die 80 may be supported by and hermetically sealed about its lower perimeter surface to surface 71 of second substrate layer 63 using either a solder or epoxy attachment material to form a leak-tight seal. Second substrate layer 63 further includes an aperture or opening 83 formed therethrough. Opening 83 may be sized and positioned such that a targeted area, such as an area associated with FETs 81 of circuit die 80, is arranged over opening 83 in an assembled state of the package. Opening 83 is used to form a recessed area in the substrate body. More specifically, joining first substrate layer 62, second substrate layer 63, and a third substrate layer 64 creates a recessed area or coolant flow chamber 82 centrally positioned and defined between a top surface of third substrate layer 64 and a bottom surface of circuit die 80.

Substrate body 60 includes an integrated fluid manifold formed therein for generating a series of high velocity fluid streams or "impingement jets" from a received pressurized fluid (coolant). These impingement jets are formed via a plurality of impingement openings or impingement nozzles 92 formed through a portion of substrate body 60. More specifically, in the exemplary embodiment, substrate layers 64,65,66 each include a plurality of apertures 92' formed therethrough (e.g. laser or mechanically drilled) such that when substrate layers 64,65,66 are assembled together (e.g. laminated), apertures 92' align (i.e. are coaxial), forming three-dimensional impingement openings 92 through substrate body 60. One or more fluid return ports is also defined through substrate body 60 via respective apertures or openings 84 formed through each substrate layer 64,65,66. As shown, impingement openings 92 are positioned such that when circuit die 80 is arranged on second substrate layer 63, impingement openings 92 are arranged proximate (i.e. under) a bottom surface of circuit die 80.

Substrate body 60 may be supported by a base 75 (e.g. a metal base). Base 75 includes an inlet opening or inlet port 76 configured for communication with a pressurized fluid source (not shown), for example, a liquid cooled cold plate. As illustrated, in an assembled state, inlet opening 76 will correspond in location to impingement openings 92 such that impingement openings 92 are arranged in fluid communication with inlet opening 76. A return opening or return port 77 is also defined through base 75 and configured for fluid communication with a fluid return portion of the pressurized fluid source. Return opening 77 corresponds in location to the return portion defined by openings 84 for receiving fluid therefrom.

Still referring to FIGS. 3A and 3B, a raised peripheral protrusion or sealing ring 78 surrounding circuit die 80 may be formed on a top surface of first substrate layer 62. Sealing ring 78 may be formed from, for example, a plurality of stacked ceramic substrate layers, each having a like-sized opening 79 formed therein. A lid (not shown) may be placed on sealing ring 78 during the manufacturing process of package 50 for hermetically sealing circuit die 80 within substrate body 60. The lid may be soldered to the package ceramic or attached by welding to sealing ring 78, which may be brazed to the package during the co-firing process. This hermetically sealed lid forms a protective barrier between the coolant and the rest of the system in the event of a catastrophic failure of the chip.

In operation, and referring to FIG. 3A, pressurized fluid or coolant (illustrated via vertical arrows) provided by an external source is communicated to impingement openings 92 via inlet opening 76 of base 75. Depending on a target flow rate, fluid supplied to inlet opening 76 may be pressurized to approximately 30 to 100 pounds per square inch (PSI). Pressurized fluid streams are expelled from the ends of each impingement opening 92 for contacting an underside of circuit die 80. After impinging on circuit die 80, expelled fluid is collected in coolant flow chamber 82 and exits package 50 via fluid return openings 84 defined through substrate body 60, as well as return opening 77 formed through base 75. By way of non-limiting example, an exemplary fluid or coolant useful in embodiments of the present disclosure comprises a mixture of 40% propylene glycol and 60% water. While embodiments of the present disclosure have been described as implementing liquid cooling, it should be understood that other embodiments may utilize gas (e.g. air) cooling implemented within a similar substrate structure.

The circuit package illustrated in FIGS. 3A and 3B illustrates an exemplary, simplified embodiment of the present disclosure. It should be understood, however, that many variations may exist without departing from the scope of the present disclosure. For example, any number of substrate layers may be used to construct a substrate body of any desired size and configuration. Likewise, the position, size and any other characteristic of, for example, the impingement openings and the inlet and return openings, can be modified according to a particular application.

While embodiments of a chip package disclosed herein have been described as constructed from a layering process, it should be understood that other fabrication techniques may be used without departing from the scope of the present disclosure. For example, three-dimensional printing processes may be implemented to form the substrate bodies described therein as monolithic or singular structures. It should be understood that by utilizing these alternative processes, the configuration of, for example, the impingement openings, as well as other fluid routing means may be altered to include, by way of non-limiting example only, fluid channels or pathways that not only move fluid vertically within a substrate body, but also horizontally and/or diagonally. These processing methods also allow for the formation of additional features on or within the coolant flow chambers described above. For example, a plurality of protrusions may be formed on a surface of the coolant flow chamber and positioned for diverting coolant flow around impingement openings so as to ensure their ability function in an unaffected manner.

Further still, while not illustrated for the purpose of simplicity, embodiments of the preset disclosure may include additional electrical circuits and/or pathways printed on one or more of the substrate layers in their green state beyond those illustrated on first substrate layer 62 as shown and described with respect to FIGS. 3A and 3B. Likewise, vias or other conductive features for connecting these or other circuits through the substrate layers may be created (e.g. drilled and filled with conductor paste) while the substrate layers are in a pre-fired state. Thus, in addition to integrated cooling provisions, embodiments of the present disclosure may also integrate power distribution, digital control, RF transmission lines and other the electrical circuit components into and/or through the package. In this way, embodiments of the present disclosure include packages containing all required electrical circuits in addition to the coolant inlet channels, impingement openings, coolant flow chambers, hermetic chip mounting surfaces and coolant return channels needed to achieve jet impingement cooling of one or more electrical devices housed within the package.

As set forth above, direct impingement cooling on an underside of a heat generating circuit element or chip has the benefits of eliminating materials (i.e. thermal junctions) between the chip and coolant, providing enhanced heat transfer therebetween. It should be understood, however, that for jet impingement cooling to perform most efficiently, a suitable ratio between a diameter (d) of the impingement openings or nozzles, and a distance (h) between these openings and a heated surface (e.g. an underside of a chip or circuit die) is required. The h/d ratio is also a function of velocity (v) of the fluid expelled from the impingement opening. In one embodiment, finite element thermal analysis may be performed to determine optimized d, h, and v values for the particular heat flux geometry of the chip or circuit being cooled.

It should be understood that fluid velocity can be changed by manipulating the coolant inlet pressure for a fixed nozzle diameter, while the h/d ratio can be established during the manufacture of dielectric or ceramic tape layer structure (i.e. the substrate body). Specifically, nozzle diameter is predetermined and fixed when the impingement openings are formed through each substrate layer. The nozzle-to-heated surface distance is set, in the above-illustrated embodiments, according to the number of substrate layers and their respective thickness used to form the coolant flow chamber under the circuit die. Other features, such as tapered impingement openings for further manipulating the shape of the fluid streams (i.e. converging or diverging) expelled therefrom are also envisioned. Tapered impingement openings may be formed by, for example, altering the size of the apertures formed through successive substrate layers, or by forming each aperture with its own taper.

Embodiments of the present disclosure have been described as providing direct contact between generated fluid streams and a surface of a circuit die to be cooled. However, other advantageous embodiments are envisioned which provide nearly the same thermal benefits as these embodiments, while facilitating easier repair in the event of a failed circuit die. In these alternate embodiments, a highly temperature-conductive shim is placed into the package where the circuit die had previously been described as being arranged. The shim can be attached to the substrate body using a high temperature braze or solder alloy. The heat producing circuit die is then attached to the shim using a high conductivity epoxy or solder which is cured or re-flowed at a temperature lower than the braze alloy used to hermetically attach the shim. The back side of the shim is then cooled using jet impingement as previously described. The heat producing chip can then be removed and replaced if it is found to be defective without damaging the package or compromising the integrity of the hermetic coolant joint in the package.

Figure 4A:
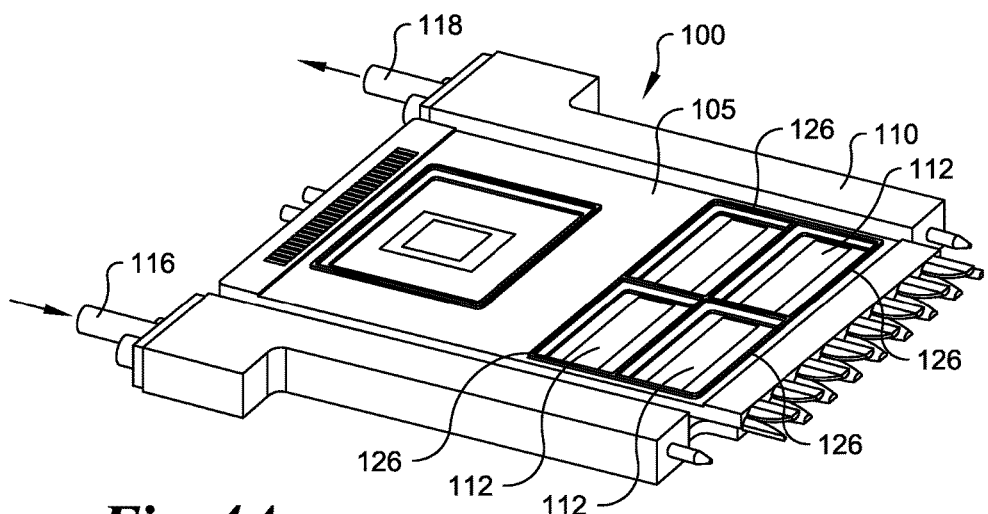
FIG. 4A is a perspective view of a jet impingement cooled chip package according to another embodiment of the present disclosure.

FIG. 4A illustrates a removable module 100 according to an embodiment of the present disclosure. Module 100 includes an electronic chip package 105 supported on an associated base or cold plate 110. Chip package 105 may comprise a similar multi-layer dielectric (e.g. ceramic) structure as shown and described with respect to FIGS. 3A and 3B. In the illustrated embodiment, however, chip package 105 comprises a plurality of circuit chips or circuit dies 112 housed thereby.

Cold plate 110 includes integrated coolant inlet and outlet ports 116,118 for delivering pressurized fluid to and from package 105 via internal fluid channels (not shown). Ports 116,118 are further configured to transport fluid to and from a host cooling system (e.g. a larger cold plate, not shown). In this way, a cold plate 110 serves as an fluid-transporting interface between chip package 105 and an external environment.

As illustrated, surrounding a portion of the plurality of circuit elements 112 are raised peripheral protruding surfaces or sealing rings 126. As set forth above with respect to FIGS. 3A and 3B, a corresponding lid (not shown) may be placed on each sealing ring 126 for hermetically sealing each circuit element within package 105. The lids may be soldered to the package ceramic or by welding to sealing rings 126. Sealing rings 126 may be brazed to the package during the co-firing process. The hermetically sealed lid forms a protective barrier between the coolant and the rest of the system in the event of a catastrophic failure of the chip. As a respective one of a plurality of sealing rings 126 and lids may be used to cover, for example, each circuit die 112 individually, this arrangement may prevent the failure of a single circuit die from damaging the remainder of the circuit dies in a package or adjacent assembly.

Figure 4B:
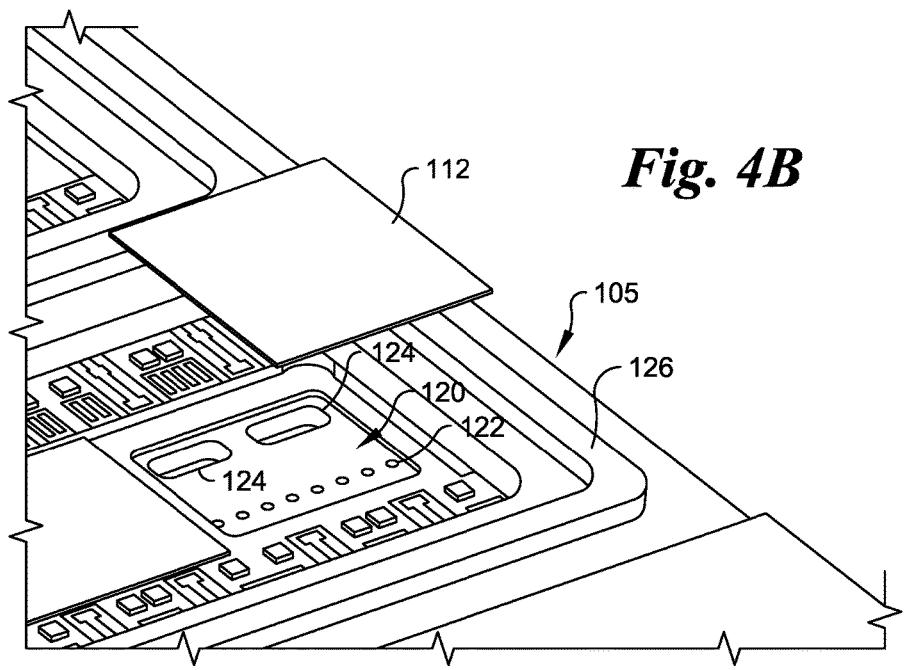
FIG. 4B is a partial section view of the jet impingement cooled chip package of FIG. 4A.

FIG. 4B is a perspective view of a section of the system of FIG. 4A shown with one circuit die 112 removed from chip package 105 for clarity. Similar to the embodiments of FIGS. 3A and 3B, package 105 includes a coolant flow chamber 120 defined therein. Impingement openings or nozzles 122 are also formed through package 105 (e.g. through ceramic substrate layers thereof) and placed in fluid communication with pressurized fluid from inlet port 116 of cold plate 110 for generating pressurized fluid streams. Impingement openings 122 are positioned such that these fluid streams contact circuit element 112 in advantageous locations, such as directly underneath its heat-generating elements (e.g. FETs). Likewise, outlet or return openings 124 are formed through package 105 (e.g. through ceramic substrate layers thereof) and are in fluid communication with output port 118 of cold plate 110 for carrying heated fluid out of coolant flow chamber 120 after impinging on circuit element 112.

Embodiments and applications of the present disclosure include, but are not limited to, applications to cool Transmit/Receive (T/R) module components. In radar applications this implementation could be represented by n×m number of transmit/receive (T/R) modules in a phased array antenna. Embodiments may also be implemented to improve thermal management of high power amplifier (HPA) assemblies, GaN/SiC, GaN/Diamond and other MMIC semiconductor material devices, laser diode packages, and the like. Embodiments provide particular advantages for cooling non-dilated millimeter wave actively electronically scanned arrays (AESAs), wherein the tight spacing (approximately 0.100") between elements prevents sufficient cooling using traditional means to avoid significant performance degradation. Embodiments of the present invention yield significant benefits with regards to efficiency, power out, and lifespan associated with such devices and/or assemblies.

While the foregoing invention has been described with reference to the above-described embodiment, various additional modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An electronic chip package comprising:
    a base including a fluid inlet opening for receiving pressurized fluid from a fluid source and a fluid outlet opening; and
    a dielectric body arranged on the base and configured to support an electronic device, the body including:
        a coolant flow chamber formed in a first surface thereof;
        a plurality of impingement openings formed through the body within the coolant flow chamber, the plurality of impingement openings in communication with the fluid inlet opening of the base for generating a plurality of fluid streams to be expelled into the coolant flow chamber and positioned such that a plurality of fluid streams to be generated are configured to impinge on the surface of the electronic device mounted to the first surface of the body; and
        a coolant return port formed through the body within the coolant flow chamber and in communication with the fluid outlet opening of the base.

2. The package of claim 1, wherein the dielectric body comprises a plurality of laminated ceramic layers.

3. The package of claim 2, wherein the dielectric body comprises at least one electrical circuit formed thereon and configured to electrically connect with the electronic device supported by the body.

4. The package of claim 1, wherein the coolant flow chamber formed in the first surface of the body defines a second surface of the body.

5. The package of claim 4, wherein the plurality of impingement openings are formed in the second surface of the body.

6. The package of claim 4, wherein the coolant return port is formed in the second surface body.

7. The package of claim 4, wherein the dielectric body further comprises:
    at least one first dielectric layer having an aperture formed therethrough for defining the coolant flow chamber; and
    at least one second dielectric layer defining the second surface of the body and having the plurality of impingement openings and the coolant return port formed therethrough.

8. The package of claim 7, wherein the dielectric body further comprises at least one third dielectric layer including:
    an aperture sized to receive the electronic device therethrough; and
    at least one electrical circuit formed thereon and configured to be connected to the electronic device.

9. The package of claim 8, further comprising a sealing ring arranged on a surface of the third dielectric layer and configured to surround the electronic device.

10. The package of claim 7, wherein the at least one second dielectric layer comprises a plurality of second dielectric layers each having the plurality of impingement openings and the coolant return port defined therethrough.

11. An electronic chip package comprising:
    a base including a fluid inlet opening for receiving pressurized fluid from a fluid source and a fluid outlet opening; and
    a dielectric body arranged on the base and configured to support an electronic device, the body including:
        a coolant flow chamber formed in a first surface thereof;
        a plurality of impingement openings formed through the body within the coolant flow chamber, the plurality of impingement openings in communication with the fluid inlet opening of the base for generating a plurality of fluid streams to be expelled into the coolant flow chamber;
        a coolant return port formed through the body within the coolant flow chamber and in communication with the fluid outlet opening of the base;
        a first dielectric layer having a first thickness and including an aperture formed therethrough in a direction of the first thickness for defining the coolant flow chamber; and
        a second dielectric layer having a second thickness, wherein the plurality of impingement openings and the coolant return port are formed through the second dielectric layer in a direction of the second thickness,
    wherein the base comprises a third thickness and the fluid inlet opening and fluid outlet opening are formed through the base in a direction of the third thickness, and
    wherein the fluid inlet opening, the plurality of impingement openings, and the coolant flow chamber are oriented such that fluid from the fluid source may uninterruptedly pass through the fluid inlet opening, the plurality of impingement openings, and the coolant flow chamber.

12. The package of claim 11, wherein the plurality of impingement openings are positioned such that a plurality of fluid streams to be generated are configured to impinge on the surface of the electronic device mounted to the first surface of the body.

13. The package of claim 12, wherein the plurality impingement openings are positioned such that the plurality of fluid streams impinge on a field effect transistor (FET) of the electronic device.

* * * * *